United States Patent
Pan

(10) Patent No.: US 7,583,143 B2
(45) Date of Patent: Sep. 1, 2009

(54) METHOD AND SYSTEM FOR DIGITALLY CONTROLLING TRANSMITTER GAIN COMPENSATION

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 109 days.

(21) Appl. No.: 11/617,458

(22) Filed: Dec. 28, 2006

(65) Prior Publication Data

US 2008/0136520 A1 Jun. 12, 2008

Related U.S. Application Data

(60) Provisional application No. 60/868,818, filed on Dec. 6, 2006.

(51) Int. Cl.
*H03F 3/45* (2006.01)
(52) U.S. Cl. .................................................. 330/254
(58) Field of Classification Search ................. 330/254, 330/305, 278
See application file for complete search history.

(56) References Cited

U.S. PATENT DOCUMENTS 7,202,740 B2 * 4/2007 Leete ........................ 330/305
2008/0030279 A1 * 2/2008 Ojo et al. .................... 330/305

* cited by examiner

*Primary Examiner*—Robert Pascal
*Assistant Examiner*—Hieu P Nguyen
(74) *Attorney, Agent, or Firm*—McAndrews, Held & Malloy, Ltd.

(57) ABSTRACT

Methods and systems for digitally controlling transmitter gain compensation are disclosed. Aspects of one method may include applying an effective negative resistance to differential outputs of amplifying circuitry to compensate for gain changes that may be due to temperature changes. The effective negative resistance may be provided via a plurality of load circuits coupled in parallel to the differential outputs. The plurality of load circuits may have similar effective negative resistances, or the plurality of load circuits may be binary weighted. Each load circuit may be selected via digital control signals that may enable the load circuit. This may allow adjusting of the effective negative resistance by selecting different load circuits.

21 Claims, 8 Drawing Sheets

METHOD AND SYSTEM FOR DIGITALLY CONTROLLING TRANSMITTER GAIN COMPENSATION

CROSS-REFERENCE TO RELATED APPLICATIONS/INCORPORATION BY REFERENCE

This application makes reference to, claims priority to, and claims benefit of U.S. Provisional Application Ser. No. 60/868,818 filed Dec. 6, 2006.

This application also makes reference to the U.S. patent application Ser. No. 11/617,479 filed on Dec. 28, 2006.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless systems. More specifically, certain embodiments of the invention relate to a method and system for digitally controlling transmitter gain compensation.

BACKGROUND OF THE INVENTION

In some conventional systems, a transmitter may broadcast radio frequency (RF) signals. Generally, RF signals are generated by upconverting baseband signals to intermediate frequency (IF) signals, and then further upconverting the IF signals to RF signals, or directly upconverting from baseband signals to RF signals. The RF signals may be amplified by power amplifiers before being transmitted by a transmit antenna. Due to the proliferation wireless devices such as telephones, walkie-talkies, personal digital assistants (PDAs), and routers in home computer networks, a transmitted signal need to be at a certain minimum strength in order for a receiving device to demodulate the transmitted signal.

Generally, controlling output power of a transmitter is important to minimize interference with other transmitted signals while still providing enough transmitted signal strength to allow a signal to be properly received and processed by a receiver. In addition, a transmitter of limited power source, for example, that in a mobile communication handset with a small battery, may need to accurately control power output in order to maximize battery life. However, a problem is that performance of various electronic devices, for example, resistors or semiconductor devices on integrated circuits may be affected by temperature. As temperature rises, a resistor's resistance may increase, thereby affecting current and voltage, and vice versa as temperature decreases. Transconductance of MOS transistors may also change with temperature and hence affect a circuit's performance. Furthermore, an inductor's quality may also change with temperature and thereby affect an RF amplifier's gain when the inductor is a load. Similarly, the current that a transistor on a chip may conduct may vary as temperature changes. The change in current and/or voltage may change the transmitter output power.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for digitally controlling transmitter gain compensation, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for digitally controlling transmitter gain compensation. Aspects of the method may comprise applying an effective negative resistance to differential outputs of amplifying circuitry to compensate for gain changes in the amplifying circuitry. The effective negative resistance may be provided via a plurality of load circuits that may be directly electrically coupled in parallel to the differential outputs. The plurality of load circuits may have similar effective negative resistances, or the plurality of load circuits may be weighted. For example, the weighting may be a binary weighting. The plurality of load circuits may be selected via digital control signals that enable the load circuits. In this manner, the effective negative resistance may be adjusted. For example, no load circuit may be selected if the digital control signals do not enable any load circuits. If all the load circuits are enabled via the digital control signals, the effective negative resistance may be due to the effects of all the load circuits. The effective negative resistance may be adjusted as temperature of a portion of chip comprising the amplifying circuitry changes.

Figure 1:
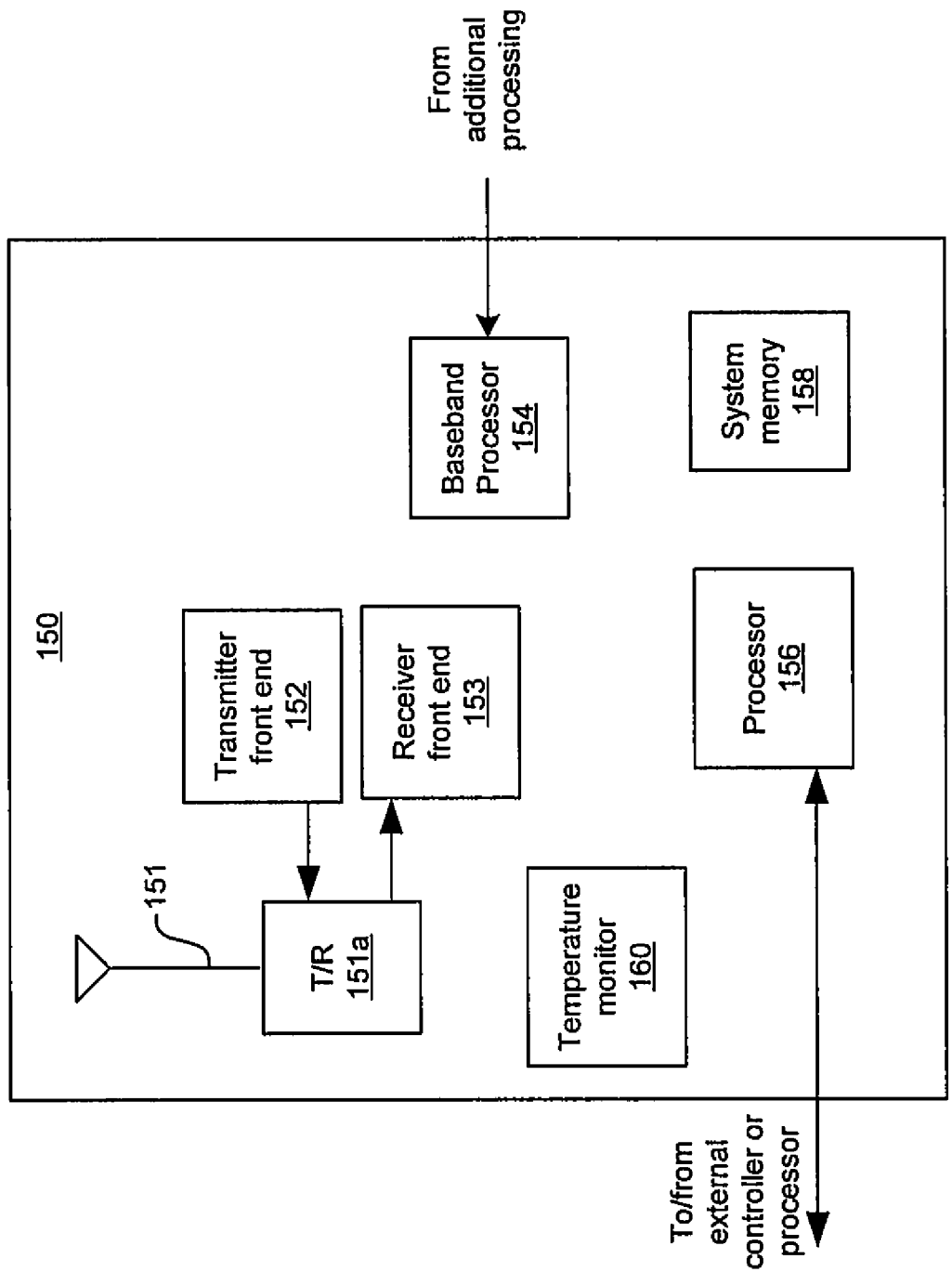
FIG. 1 is a block diagram of an exemplary wireless system, which may be utilized in connection with an embodiment of the invention.

FIG. 1 is a block diagram of an exemplary wireless system, which may be utilized in connection with an embodiment of the invention. Referring to FIG. 1, the wireless system 150 may comprise a transmitting antenna 151, a transmitter/receiver switch 151a, a transmitter front end 152, a receiver front end 153, a baseband processor 154, a processor 156, a system memory 158, and a temperature monitor 160. The transmitter/receiver switch 151a may comprise suitable circuitry that enables the antenna 151 to be used for both receiving and transmitting. The transmitter front end (TFE) 152 may comprise suitable logic, circuitry, and/or code that may be adapted to upconvert a baseband signal directly to an RF signal and to transmit the RF signal via a transmitting antenna 151. The TFE 152 may also be adapted to upconvert a baseband signal to an IF signal, and/or upconvert the IF signal to an RF signal and then transmit the RF signal via the transmitting antenna 151. The TFE 152 may be adapted to execute other functions, for example, filtering the baseband signal, and/or amplifying the baseband signal.

The receiver front end (RFE) 153 may comprise suitable logic, circuitry, and/or code that may be adapted to downconvert a RF signal directly to a baseband signal for further processing. The RFE 153 may also be adapted to downconvert a RF signal to an IF signal, and/or downconvert the IF signal to a baseband signal for further processing. The RFE 153 may be adapted to execute other functions, for example, filtering the baseband signal, and/or amplifying the baseband signal.

The baseband processor 154 may comprise suitable logic, circuitry, and/or code that may be adapted to process baseband signals, for example, convert a digital signal to an analog signal, and/or vice-versa. The processor 156 may be any suitable processor or controller such as a CPU or DSP, or any type of integrated circuit processor. The processor 156 may comprise suitable logic, circuitry, and/or code that may be adapted to control the operations of the TFE 152 and/or the baseband processor 154. For example, the processor 156 may be utilized to update and/or modify programmable parameters and/or values in a plurality of components, devices, and/or processing elements in the TFE 152 and/or the baseband processor 154. Control and/or data information, which may include the programmable parameters, may be transferred from at least one controller and/or processor, which may be part of the wireless system 150, to the processor 156. Similarly, the processor 156 may be adapted to transfer control and/or data information, which may include the programmable parameters, to at least one controller and/or processor, which may be part of the wireless system 150.

The processor 156 may utilize the received control and/or data information, which may comprise the programmable parameters, to determine an operating mode of the TFE 152. For example, the processor 156 may be utilized to select a specific frequency for a local oscillator, or a specific gain for a variable gain amplifier. Moreover, the specific frequency selected and/or parameters needed to calculate the specific frequency, and/or the specific gain value and/or the parameters needed to calculate the specific gain, may be stored in the system memory 158 via the processor 156. The information stored in system memory 158 may be transferred to the TFE 152 from the system memory 158 via the processor 156.

The system memory 158 may comprise suitable logic, circuitry, and/or code that may be adapted to store a plurality of control and/or data information, including parameters needed to calculate frequencies and/or gain, and/or the frequency value and/or gain value.

The temperature monitor 160 may comprise suitable logic, circuitry, and/or code that may be adapted to determine temperature at a measuring point, for example, in the wireless system 150. The temperature may be determined, for example, in degrees Centigrade. The temperature monitoring block 160 may communicate information to, for example, the processor 156. The processor 156 may use the temperature information, for example, to determine gain compensation at different temperatures for different devices.

Figure 2A:
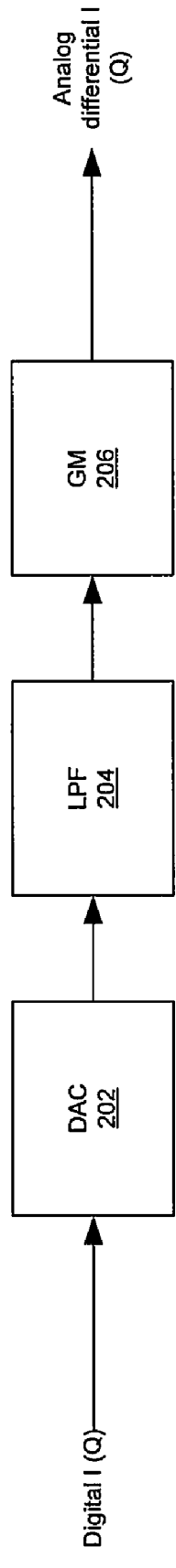
FIG. 2A is a block diagram of an exemplary transmitter front end, which may be utilized in connection with an embodiment of the invention.

FIG. 2A is a block diagram of an exemplary transmitter front end, which may be utilized in connection with an embodiment of the invention. Referring to FIG. 2, there is shown a DAC block 202, a low-pass filter (LPF) block 204, and a Gm block 206 for each of I and Q channels for a signal to be transmitted. The DAC block 202 may convert two digital signals from, for example, the baseband processor 154, to two analog voltage outputs. The two digital signals may be differential signals and the two analog voltage outputs may also be differential. The LPF block 204 may independently filter the differential analog voltage outputs from the DAC block 202. The Gm block 206 may generate differential current outputs that may correspond to the filtered differential analog voltage outputs communicated by the LPF block 204. Accordingly, the I channel may be processed by a first DAC block 202, a first LPF block 204, and a first Gm block 206, and the Q channel may be processed by a second DAC block 202, a second LPF block 204, and a second Gm block 206.

Figure 2B:
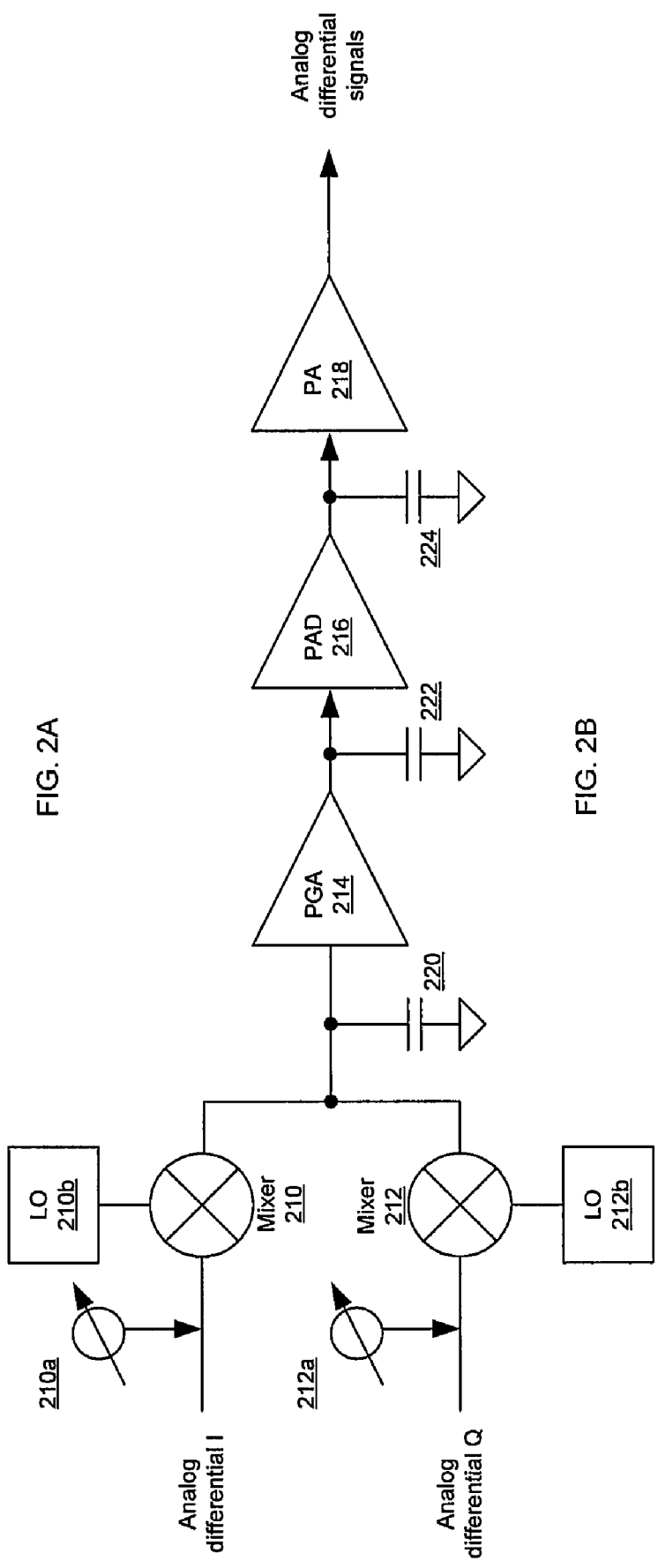
FIG. 2B is a block diagram of an exemplary transmitter front end, which may be utilized in connection with an embodiment of the invention.

FIG. 2B is a block diagram of an exemplary transmitter front end, which may be utilized in connection with an embodiment of the invention. Referring to FIG. 2B, there is shown mixer blocks 210 and 212, variable current source blocks 210a and 212b, local oscillators (LOs) 210b and 212b, a programmable gain amplifier (PGA) block 214, a power amplifier driver (PAD) block 216, the power amplifier (PA) block 218, and variable capacitor blocks 220, 222, and 224. The mixer blocks 210 and 212 may upconvert each of differential input signals to generate differential output signals that may be at a radio frequency used for transmission. The mixer blocks 210 and 212 may also amplify the differential input signals.

The variable current source blocks 210a and 212a may comprise suitable logic, circuitry, and/or code that may be used to compensate for any undesired effects resulting from local oscillator feed-through (LOFT) in differential signals processed by the transmitter front end 152. The amount of current from each of the variable current source blocks 210a and 212a may be controlled by circuitry and/or a processor, for example, the baseband processor 154 and/or the processor 156. The PGA block 214 may amplify differential input signals with variable gain to generate differential output signals. The gain of the PGA block 214 may be adjusted by circuitry and/or a processor, such as, for example, the baseband processor 154 or the processor 156. The PAD block 216 and the PA block 218 may amplify differential input signals to generate differential output signals. The variable capacitor blocks 220, 222, and 224 may comprise suitable logic, circuitry, and/or code that may enable varying a capacitive load to the mixer blocks 210 and 212, the PGA block 214, and the PAD block 224, respectively, to tune a quality factor Q for each of the blocks. For example, this may compensate for changes in operation characteristics due to temperature.

In operation, the differential signals may be upconverted to radio frequency by the mixer blocks 210 and 212, and the differential signals from the outputs of the mixer blocks 210 and 212 may form a single pair of differential signals. The mixers 210 and 212, the PGA 214, the PAD 216, and the PA 218 may comprise devices that amplify signals. The variable capacitor blocks 220, 222, and 224 may be controlled by circuitry and/or a processor, such as, for example, the baseband processor 154 and/or the processor 156, to tune a center frequency, which may be defined as the frequency at which an RF amplifier with an inductive load may have a maximum gain, for the mixers 210 and 212, the PGA 214, and the PAD 216. Accordingly, the upconverted differential signals may be more efficiently amplified to a level sufficient for transmission. However, gain of the amplifying devices in the mixers 210 and 212, the PGA 214, the PAD 216 and the PA 218 may change as temperature varies. It may be desirable to control total gain as temperature changes. An exemplary embodiment of the invention for digitally controlling gain is described with respect to FIGS. 3-7.

Figure 3:
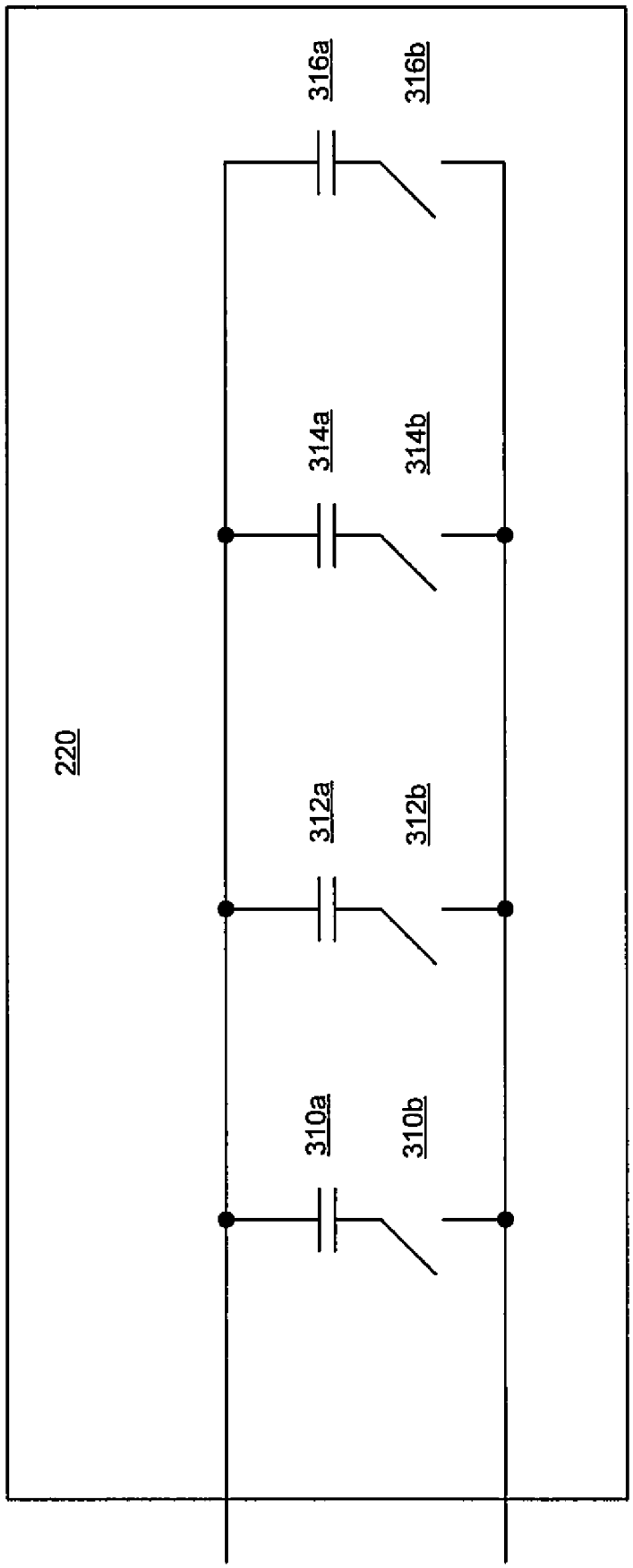
FIG. 3 is a block diagram of an exemplary capacitive load, which may be utilized in connection with an embodiment of the invention.

FIG. 3 is a block diagram of an exemplary capacitive load, which may be utilized in connection with an embodiment of the invention. Referring to FIG. 3, there is shown the variable capacitor block 220, which may comprise a plurality of capacitors 310a, 312a, 314a, and 316a, and a plurality of switches 310b, 312b, 314b, and 316b. Opening or closing of each of the switches 310b, 312b, 314b, and 316b may be controlled by, for example, the baseband processor 154 and/or the processor 156. A capacitance of the variable capacitor block 220 may be changed by opening or closing switches the 310b, 312b, 314b, and 316b. The capacitances of the capacitors corresponding to the switches that may be closed may be added together. The switches 310b, 312b, 314b, and 316b may be controlled by circuitry and/or a processor, such as, for example, the baseband processor 154 and/or the processor 156.

The capacitances of the capacitors in the capacitive load may each be the same, or the capacitances may be weighted. If the capacitance of each capacitor is the same, the total capacitance of the variable capacitor block 220 may vary from 0 capacitive units to 4 capacitive units. If the capacitances are weighted, for example, in a binary manner, the largest capacitor may be the capacitor 310a with 8 capacitive units. Then the capacitor 312a may have a capacitance of 4 capacitive units and the capacitor 314a may have a capacitance of 2 capacitive units. The smallest capacitor may be the capacitor 316a with a capacitance of 1 capacitive unit. Accordingly, the total capacitance may vary from 0 to 15 capacitive units. The number of capacitors in the variable capacitor block 220, 222, and/or 224 may be design dependent.

Figure 4B:
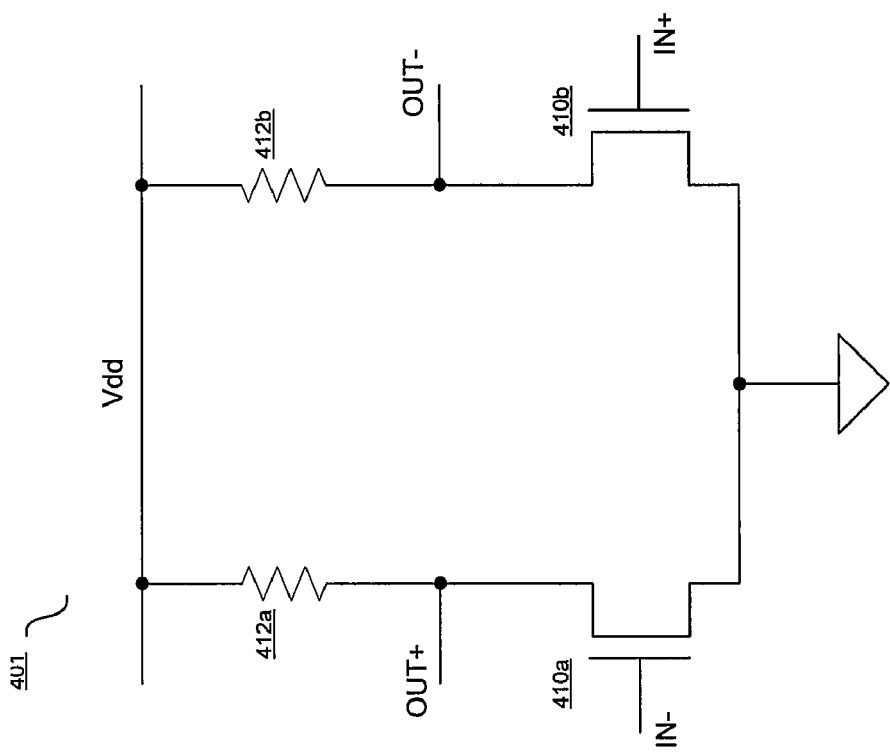
FIG. 4B is a block diagram of an exemplary differential amplifier, which may be utilized in connection with an embodiment of the invention.
Figure 4A:
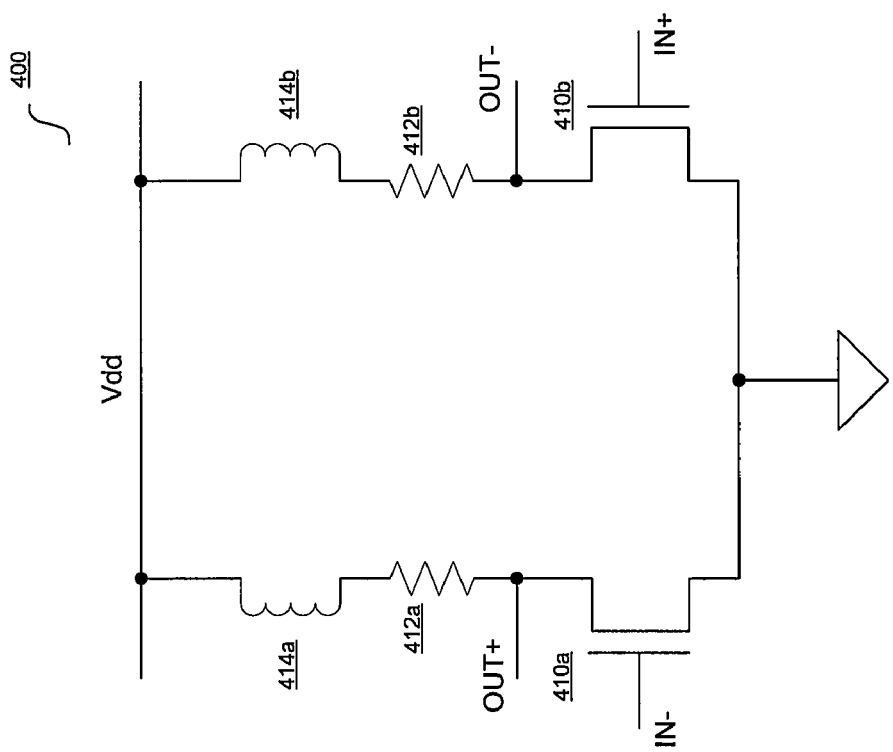
FIG. 4A is a block diagram of an exemplary differential amplifier, which may be utilized in connection with an embodiment of the invention.

FIG. 4A is a block diagram of an exemplary differential amplifier, which may be utilized in connection with an embodiment of the invention. Referring to FIG. 4A, there is shown a differential amplifier 400 comprising transistors 410a and 410b, resistors 412a and 412b, and inductors 414a and 414b. The mixers 210 and 212, the PGA 214, the PAD 216, and the PA 218 may each comprise, for example, at least one differential amplifier that may be similar to the differential amplifier 400.

The resistors 412a and 412b may, for example, exemplify resistance due to the inductors 414a and 414b. When the transistors 410a and 410b are coupled to a capacitive load, such as, for example, the capacitive load 220 and/or the capacitive load at the input of the PGA 214, an equivalent impedance may be described as:

$$Zeq = (R + j\omega L) \| (1/(j\omega C)). \tag{1}$$

Where R may be, for example, the resistance of the resistor 412a, $\omega$ may be frequency in radians, L may be inductance of the inductor 414a, and C may be a capacitance of the capacitive load coupled to the output OUT+. At a desired frequency $\omega_0$, $\omega_0$ may be equal to $1/(LC)^{1/2}$, and $\omega_0 L$ may equal $1/(\omega_0 C)$. Accordingly, $$Zeq \sim = \omega_0 L/(\omega_0 RC) \tag{2}$$

where other terms that may be much less than L/(RC) may be ignored.

Zeq may then be expressed as:

$$\begin{aligned}
Zeq &= \omega_0 L/(\omega_0 RC) & (3)\\
&= (\omega_0 L)/R * (1/(\omega_0 C)) \\
&= (\omega_0 L/R) * (\omega_0 L) & (4)\\
&= (\omega_0^2 L^2)/R & (5)\\
&= (\omega_0 L/R) * (\omega_0 L/R) * R & (6)\\
&= Q * Q * R & (7)
\end{aligned}$$

where Q may be defined as a quality factor described as $\omega_0 L/R$, and the quality factor Q may be a number without any units. Therefore, as described by the equation (6), as resistance increases, for example, as temperature increases, the quality factor Q, which equals $\omega_0 L/R$, may decrease, and, hence, the equivalent resistance Zeq may decrease as temperature increases. The differential amplifier 400 at $\omega_0$ may be described by the circuitry shown with respect to FIG. 4B.

FIG. 4B is a block diagram of an exemplary differential amplifier, which may be utilized in connection with an embodiment of the invention. Referring to FIG. 4B, there is shown the differential amplifier 401 that may comprise the transistors 410a and 410b and the resistors 412a and 412b. The differential amplifier 401 may represent the differential amplifier 400 at the desired frequency $\omega_0$.

An amplifying device may be characterized as:

$$I_{out} = V_{in} * Gm \tag{8}$$

A voltage output of the amplifying device may be described as:

$$V_{out} = I_{out} * Zeq \tag{9}$$

$$= I_{out} * (Q * Q * R) \tag{10}$$

Hence, a voltage gain may be described as:

$$(V_{out}/V_{in}) = (I_{out} * (Zeq))/(I_{out}/Gm) \tag{11}$$

$$= Zeq * Gm \tag{12}$$

Accordingly, as temperature increases, the equivalent resistance Zeq may decrease, and, therefore, the amplifier gain of the amplifying device may also decrease as described by the equation (12). Gm, which may be a transconductance of an input device, may decrease as temperature increases. This may result in an exemplary amplifier gain vs. temperature curve shown in FIG. 4C.

Figure 4D:
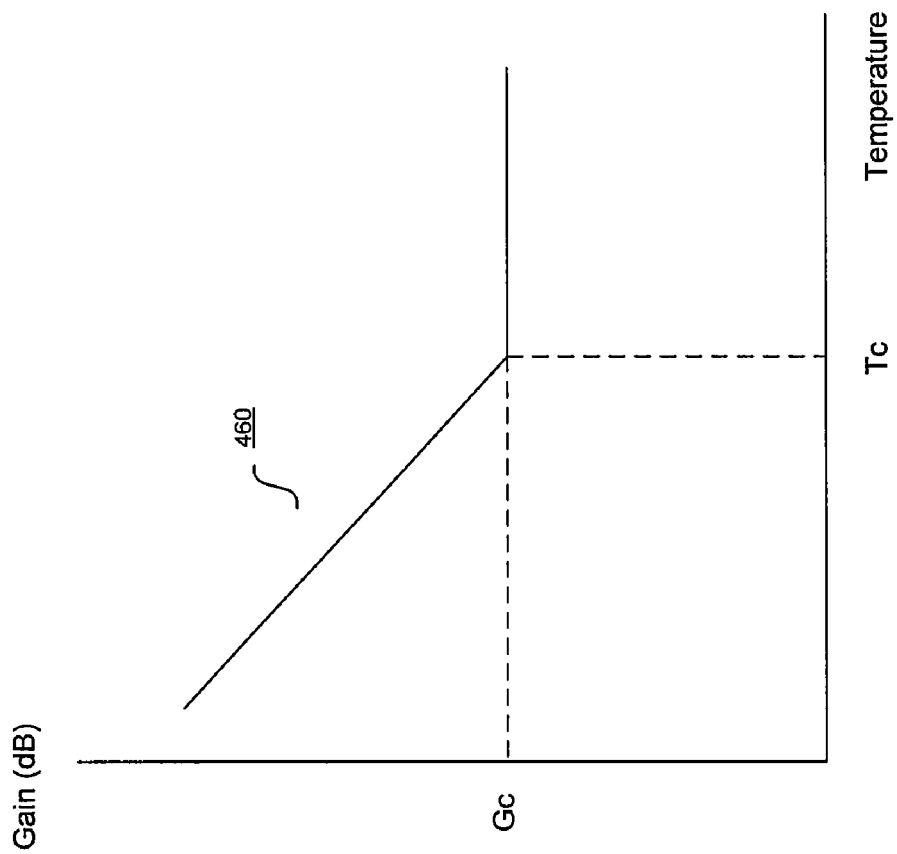
FIG. 4D is a graph of an exemplary amplifier gain vs. temperature curve after compensation for temperature.

In devices where the gain may need to be controlled, such as, for example, mobile communications devices, the device may need to be controlled to compensate for the change in the gain with respect to temperature. Normally a circuit may be designed to have enough gain at room temperature. However, as temperature decreases, the gain will increase. Accordingly, a baseband processor may trim down the gain with proper gain control setting. But as temperature increases, the transmitter gain may become lower than required even at maximum gain setting. Accordingly, since the baseband processor may not be able to increase the gain beyond the maximum gain setting, the transmitter may not be able to generate enough signal gain. Various embodiments of the invention may allow digitally controlled gain compensation to counter act decrease in gain as temperature increases. An exemplary chart in FIG. 4D illustrates this. Various embodiments of the invention may be described with respect to the FIGS. 5A, 5B, 6, and 7 for compensating for transmitter gain as temperature changes.

Figure 4C:
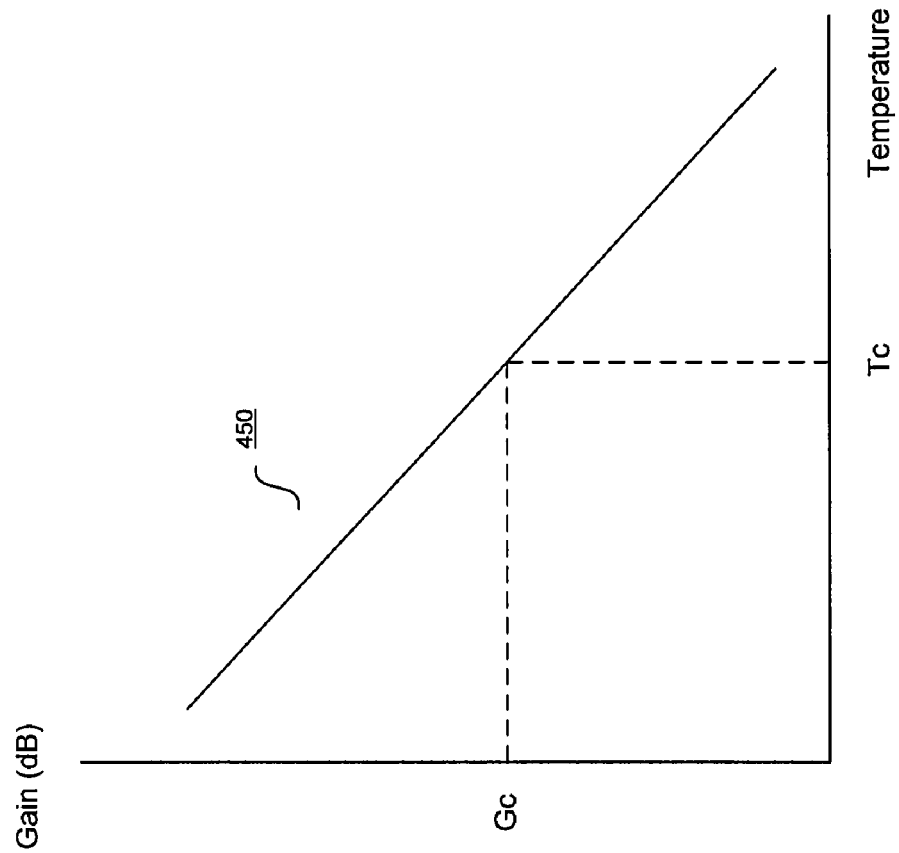
FIG. 4C is a graph of an exemplary amplifier gain vs. temperature curve.

FIG. 4C is a graph of an exemplary amplifier gain vs. temperature curve. Referring to FIG. 4C, there is shown a graph where the horizontal axis is for temperature as it increases to the right, and the vertical axis is for gain of an amplifying device, such as, for example, the mixer blocks 210b and 212b, the PGA block 214, the PAD block 216, and the PA block 218, as it increases toward the top. The amplifying device may be a part of the wireless system 150.

The gain curve 450 varies inversely with temperature. That is, as temperature increases, the gain of the amplifying device decreases, and as temperature decreases, the gain of the amplifying device increases. There is shown a gain point Gc, which may be a minimum acceptable gain for an amplifying device. The gain point Gc may be design and/or implementation criterion. There is also shown a temperature point Tc, which corresponds to the temperature at which the gain point Gc may occur without temperature compensation. Gain below Gc may affect transmission operation of the wireless system 150 such that a receiving device may not be able to accurately receive the information transmitted by the wireless system 150.

FIG. 4D is a graph of an exemplary amplifier gain vs. temperature curve after compensation for temperature. Referring to FIG. 4D, there is shown a graph where the horizontal axis is for temperature as it increases to the right, and the vertical axis is for gain of an amplifying device, such as, for example, the mixer blocks 210b and 212b, the PGA block 214, the PAD block 216, and the PA block 218, as it increases toward the top. The amplifying device may be a part of the wireless system 150.

The gain curve 460 varies inversely with temperature until the temperature increases to the temperature point Tc. However, as temperature compensation is used at temperature of Tc or greater, the gain curve may substantially flatten out to the minimum gain Gc desired. Since gain compensation may be constant for a range of temperatures, the actual gain curve may decrease from beginning of a temperature range to the end of the temperature range, when the next compensation may increase gain again. The temperature ranges for specific gain compensation may be design and/or implementation dependent.

Figure 5B:
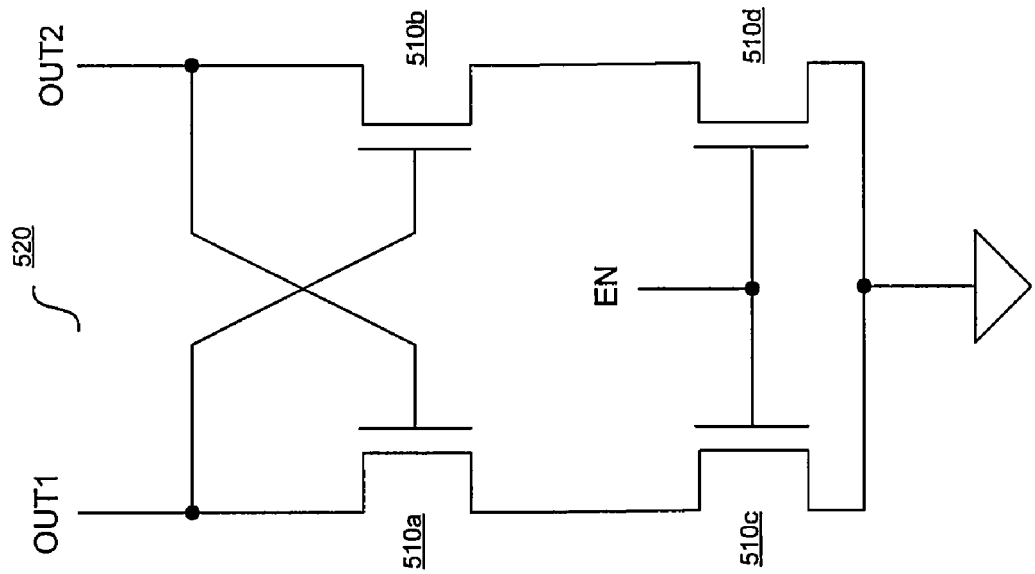
FIG. 5B is an exemplary block diagram of a negative load, in accordance with an embodiment of the invention.
Figure 5A:
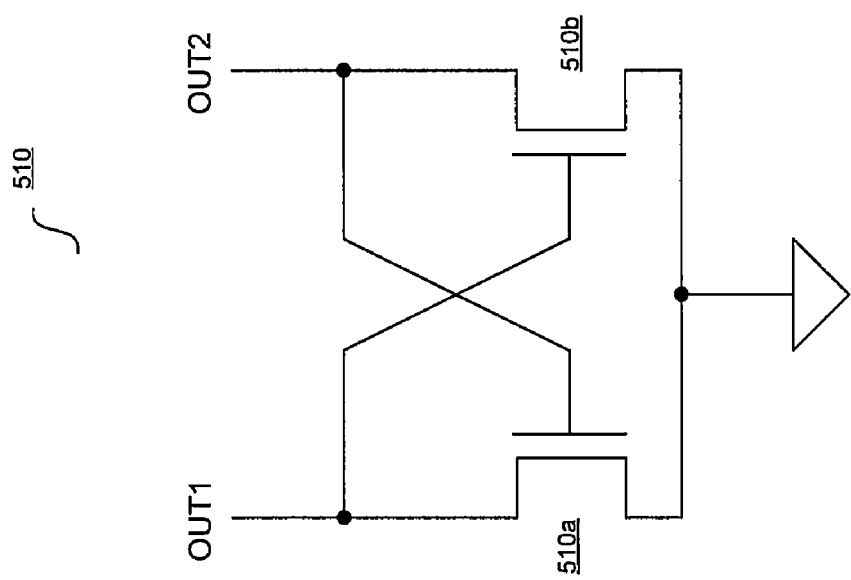
FIG. 5A is an exemplary block diagram of a negative load, in accordance with an embodiment of the invention.

FIG. 5A is an exemplary block diagram of a negative load, in accordance with an embodiment of the invention. Referring to FIG. 5A, there is shown the negative load 510 that may comprise transistors 510a and 510b. In this configuration, any voltage change at the gate of the transistor 510a may be reflected as an inverse change in the opposite direction for the voltage at the output OUT1. For example, if the voltage increases at the gate of the transistor 510a, the current through the transistor 510a may increase, and the voltage at the output OUT1 may decrease. Similarly, any change at the gate of the transistor 510b may be reflected as an inverse change in the opposite direction for the voltage at the output OUT2.

The operation of the transistors 510a and 510b may be described using Ohm's law and equation (8). For the transistor 510a:

$$I_{OUT1} = V_{OUT2}/R_{OUT1} \quad (13)$$

$I_{OUT1}$ may be the current at the output OUT1, $V_{OUT2}$ may be the voltage at the gate of the transistor 510a, which may be the voltage at the output OUT2, and R may be the effective resistance of the load to the transistor 510a.

Therefore, $$R_{OUT1} = V_{OUT2}/I_{OUT1} \quad (14)$$

and if the negative load 510 is a differential circuit where the outputs OUT1 and OUT2 may comprise differential output voltages, $V_{OUT2}$ may be opposite in polarity to the voltage at the output OUT1. Accordingly, the output resistance at the output OUT1 may be described as:

$$R_{OUT1} = -V_{OUT1}/I_{OUT1} \quad (15)$$

where V may

Using the equation (8), this may also be expressed as:

$$I_{OUT} = V_{in} * Gm \quad (8)$$

and, hence, $$I_{OUT1} = (V_{OUT2}) * Gm \quad (16)$$

$$= (-V_{OUT1}) * Gm. \quad (17)$$

Accordingly, $$R_{OUT1} = -1/Gm. \quad (18)$$

Similarly, the transistor 510b may be described as:

$$R_{OUT2} = -1/Gm \quad (19)$$

and, hence, the effective resistance $R_{OUT}$ of the negative load 510 may be described as:

$$R_{OUT} = -1/Gm. \quad (20)$$

An embodiment of the invention may, for example, couple the output OUT1 to the output OUT+ of the differential amplifier 400 and the output OUT2 to the output OUT− of the differential amplifier 400. The differential amplifier 400 may represent, for example, the amplifying circuitry of the mixer 210. Accordingly, the negative load 510 may provide a load with effective negative resistance to the mixer 210. The effect of the negative load 510 may be described below using exemplary resistance values for explanatory purposes.

For example, the equivalent impedance Zeq of the differential amplifier 400 may be 200 ohms and the effective resistance $R_{OUT}$ of the negative load 510 may be −400 ohms. Since the equivalent impedance Zeq and the effective resistance $R_{OUT}$ may be in parallel, the total resistance $R_{total}$ may be calculated:

$$R_{total} = Zeq \| R_{OUT} \quad (21)$$

$$= (Zeq * R_{OUT})/(Zeq + R_{OUT})$$

$$= 200 * (-400)/(200 - 400)$$

$$= -800/-200$$

$$= 400.$$

Accordingly, since the total output resistance $R_{total}$ may be effectively increased by coupling the negative load 510 in parallel with the mixer 210. The increased effective output resistance may accordingly increase gain of the mixer 210.

FIG. 5B is an exemplary block diagram of a negative load, in accordance with an embodiment of the invention. Referring to FIG. 5B, there is shown the transistors 510a and 510b, and 510c and 510d. The transistors 510c and 510d may receive an enable signal EN at the base. The enable signal EN may be controlled by circuitry and/or a processor, such as, for example, the baseband processor 154 and/or the processor 156. When the enable signal is asserted, the transistors 510c and 510d may allow the transistors 510a and 510b to operate. Accordingly, if the negative load 520 is coupled to a differential amplifier, for example, as described with respect to the FIG. 5A, the negative load 520 may be enabled or disabled for the differential amplifier 400. When the negative load 520 is disabled, the effect may be as if the negative load 520 may not be coupled to the differential amplifier 400. When the negative load is enabled, the effect to the differential amplifier 400 may be as described with respect to FIG. 5A.

Figure 6:
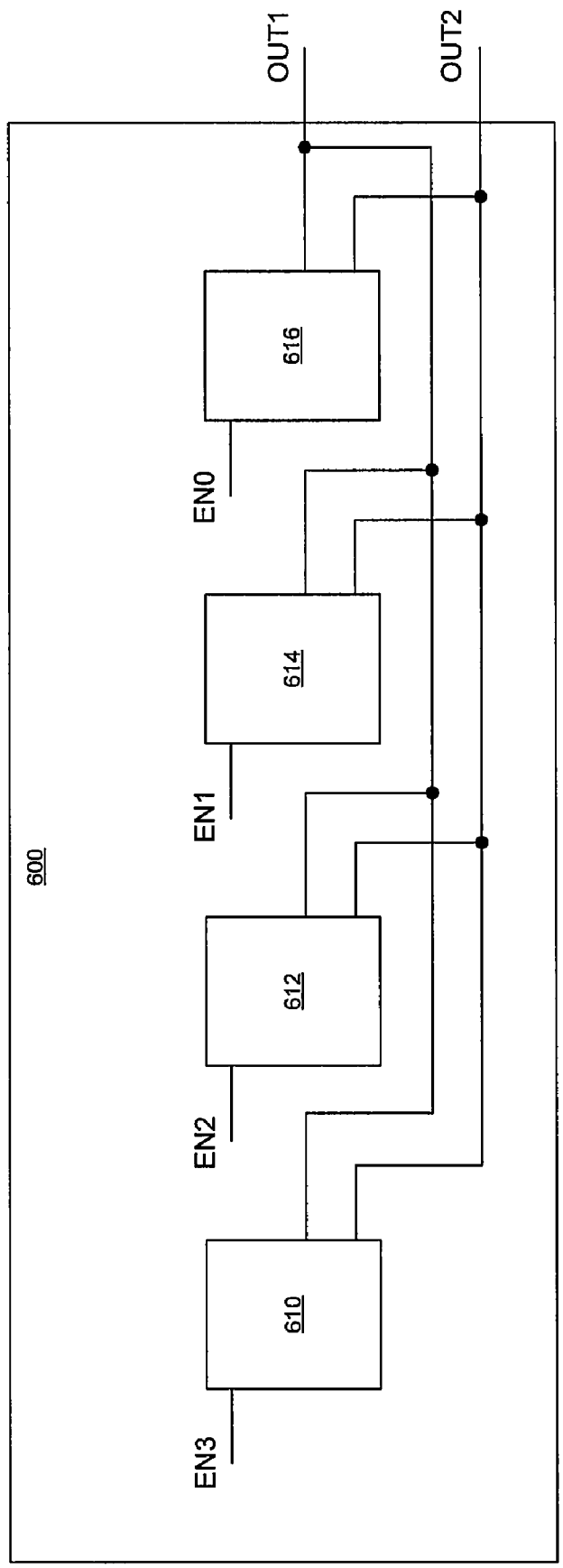
FIG. 6 is an exemplary block diagram of a variable negative load, in accordance with an embodiment of the invention.

FIG. 6 is an exemplary block diagram of a variable negative load, in accordance with an embodiment of the invention. Referring to FIG. 6, there is shown a negative load block 600 that may comprise negative loads 610, 612, 614, and 616 that may be similar to the negative load 520. Accordingly, the negative loads 610, 612, 614, and 616 may each have an enable signal EN3, EN2, EN1, and EN0, respectively, communicated to it. The outputs OUT1 and OUT2 may be coupled to differential outputs of a differential amplifier as described with respect to FIG. 5A.

The number of the negative loads in the negative load block 600 may be design dependent. The resistances of the negative loads in the negative load block 600 may also be design dependent. For example, an implementation of the invention may design the negative load block 600 to have, for example, four negative loads 616, 614, 612, and 610, where each negative load may have a similar resistance value. Other implementations of the invention may design a weighted resistance value for the four negative loads. For example, the negative load 616, 614, 612, and 610 may be binary weighted to have a resistance of −1 unit, −2 units, −4 units, and −8 units, respectively. Accordingly, by enabling the negative loads 616, 614, 612, and 610, the total resistances of the negative loads 616, 614, 612, and 610 may range from zero units, −1 unit, −½ unit, −⅓ unit, . . . , −1/15 unit. By allowing the absolute value of the smallest resistance, 1/15 unit, to be larger than the output resistance of a differential amplifier, such as, for example, the differential amplifier 400, the total output resistance may be increased when the negative load block 600 is coupled in parallel with the differential amplifier 400 as described with respect to FIG. 5A.

Figure 7:
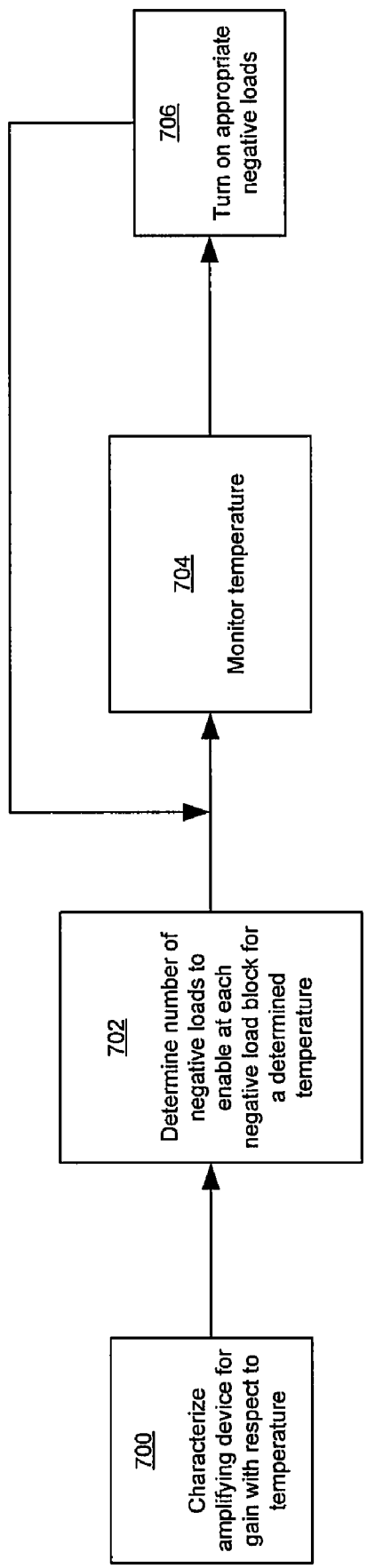
FIG. 7 is an exemplary flow diagram for digitally controlling transmitter gain, in accordance with an embodiment of the invention.

FIG. 7 is an exemplary flow diagram for digitally controlling transmitter gain, in accordance with an embodiment of the invention. Referring to FIG. 7, there is shown steps 700 to 706. In step 700, various circuitry that may require gain compensation for temperature may be characterized. For example, the differential amplifier 400 that may represent the amplifying portion of the mixer 210 may be characterized for change in gain with respect to temperature. In step 702, specific negative loads in the negative load block 600 may be determined to be turned on for that temperature. For example, a design may allow changing the effective load for an amplifying device such as the mixer 210 at increments of 20 degrees Centigrade starting from 40 degrees Centigrade.

In step 704, temperature may be monitored. The temperature may be monitored at a chip level, or for portions of a chip. The temperature monitoring level may be design and/or implementation dependent. The temperature monitoring may occur via, for example, the temperature monitor 160. In step 706, the negative loads for specific negative load block may be enabled at appropriate temperatures. The negative loads enabled for an amplifying device may differ for each amplifying device. The enabling of the negative loads may be controlled by circuitry and/or a processor, such as, for example, the baseband processor 154 and/or the processor 156.

In accordance with an embodiment of the invention, aspects of an exemplary system may comprise the negative load block 600 that may provide an effective negative resistance to differential outputs of, for example, the mixer 210 to compensate for gain changes. The negative load block 600 may comprise a plurality of negative loads 610, 612, 614, and 616 that may be directly electrically coupled in parallel to the differential outputs of the mixer 210. The plurality of negative loads 610, 612, 614, and 616 may have similar effective negative resistances, or the effective negative resistance of each of the negative loads 610, 612, 614, and 616 may be weighted. The weighting, for example, may be a binary weighting. The plurality of negative loads 610, 612, 614, and 616 may be digitally controlled, where each negative load may be enabled to add to the effective negative resistance. The digitally controlling of the negative loads 610, 612, 614, and 616 may be via circuitry and/or a processor, such as, for example, the baseband processor 154 and/or the processor 156. The effective negative resistance of the negative load block 600 may be adjusted as temperature varies for a portion of chip that comprises the mixer. An amplifier's gain vs. temperature curve as shown in FIG. 4D may then be achieved digitally using this algorithm/flow diagram.

Another embodiment of the invention may provide a machine-readable storage, having stored thereon, a computer program having at least one code section executable by a machine, thereby causing the machine to perform the steps as described above for digitally controlling transmitter gain compensation.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will comprise all embodiments falling within the scope of the appended claims.

What is claimed is:

1. A method for processing signals, the method comprising: digitally controlling selection of each of a plurality of load circuits to apply an effective negative resistance to differential outputs of amplifying circuitry to compensate for gain changes in said amplifying circuitry.

2. The method according to claim 1, comprising providing said effective negative resistance with said plurality of load circuits directly electrically coupled in parallel to said differential outputs.

3. The method according to claim 2, wherein said plurality of load circuits have similar said effective negative resistances.

4. The method according to claim 2, comprising weighting said effective negative resistance of each of said plurality of load circuits.

5. The method according to claim 4, wherein said weighting is a binary weighting.

6. The method according to claim 2, comprising digitally controlling selection of each of said plurality of load circuits to adjust said effective negative resistance.

7. The method according to claim 1, comprising adjusting said effective negative resistance as temperature of a portion of chip comprising said amplifying circuitry changes.

8. A machine-readable storage having stored thereon, a computer program having at least one code section for processing signals, the at least one code section being executable by a machine for causing the machine to perform steps comprising: digitally controlling selection of each of a plurality of load circuits to apply an effective negative resistance to differential outputs of amplifying circuitry to compensate for gain changes in said amplifying circuitry.

9. The machine-readable storage according to claim 8, wherein the at least one code section comprises code for providing said effective negative resistance with said plurality of load circuits directly electrically coupled in parallel to said differential outputs.

10. The machine-readable storage according to claim 9, wherein said plurality of load circuits have similar said effective negative resistances.

11. The machine-readable storage according to claim 9, wherein the at least one code section comprises code for weighting said effective negative resistance of each of said plurality of load circuits.

12. The machine-readable storage according to claim 11, wherein said weighting is a binary weighting.

13. The machine-readable storage according to claim 9, wherein the at least one code section comprises code for digitally controlling selection of each of said plurality of load circuits to adjust said effective negative resistance.

14. The machine-readable storage according to claim 8, wherein the at least one code section comprises code for adjusting said effective negative resistance as temperature of a portion of chip comprising said amplifying circuitry changes.

15. A system for processing signals, the system comprising: one or more circuits that enables digital control of selection of each of a plurality of load circuits to apply an effective negative resistance to differential outputs of amplifying circuitry to compensate for gain changes in said amplifying circuitry.

16. The system according to claim 15, wherein said load block comprises said plurality of load circuits directly electrically coupled in parallel to said differential outputs.

17. The system according to claim 16, wherein said plurality of load circuits have similar said effective negative resistances.

18. The system according to claim 16, wherein said effective negative resistance of each of said plurality of load circuits is weighted.

19. The system according to claim 18, wherein said weighting is a binary weighting.

20. The system according to claim 16, wherein each of said plurality of load circuits is digitally controlled to adjust said effective negative resistance.

21. The system according to claim 15, comprising one or both of a processor and circuitry that enables adjusting said effective negative resistance as temperature of a portion of chip comprising said amplifying circuitry changes.

* * * * *